United States Patent [19]

Scifres et al.

[11] Patent Number: 4,984,242

[45] Date of Patent: Jan. 8, 1991

[54] GAAS/ALGAAS HETEROSTRUCTURE LASER CONTAINING INDIUM

[75] Inventors: Donald R. Scifres; David F. Welch, both of San Jose; John Endriz, Belmont; William Streifer, Palo Alto, all of Calif.

[73] Assignee: Spectra Diode Laboratories, Inc., San Jose, Calif.

[21] Appl. No.: 408,675

[22] Filed: Sep. 18, 1989

[51] Int. Cl.$^5$ .......................... H01S 3/19; H01L 33/00
[52] U.S. Cl. ............................................. 372/45; 357/4; 357/16; 357/17
[58] Field of Search ................. 372/43, 44, 45; 357/4, 357/16, 17

[56] References Cited

U.S. PATENT DOCUMENTS

| | | | |
|---|---|---|---|
| 4,573,161 | 2/1986 | Sakai et al. | 372/45 |
| 4,611,328 | 9/1986 | Liu et al. | 372/45 |
| 4,661,961 | 4/1987 | Nelson et al. | 372/46 |
| 4,712,219 | 12/1987 | Yano et al. | 372/45 |
| 4,737,960 | 4/1988 | Tsang | 372/45 |
| 4,740,977 | 4/1988 | Ikeda | 372/45 |
| 4,769,821 | 9/1988 | Gotoh | 372/45 |
| 4,860,297 | 8/1989 | Hayakawa et al. | 372/45 |

OTHER PUBLICATIONS

W. T. Tsang, "Extension of Lasing Wavelengths...", Appl. Phys. Lett., 38 (9), May 1, 1981, pp. 661–663.
G. C. Osbourn, "Strained-Layer Superlattices: A Brief Review", IEEE Journal of Quantum Electronics, vol. QE-22, No. 9, Sep. 1986, pp. 1677–1681.
S. E. Fischer et al., "Long-Lived InGaAs Quantum Well Lasers", Appl. Phys. Lett. 54 (19), May 8, 1989, pp. 1861–1862.
W. Walukiewicz, "Dislocation Density Reduction...", Appl. Phys. Lett. 54 (20), May 15, 1989, pp. 2009–2011.

Primary Examiner—Georgia Epps
Attorney, Agent, or Firm—Thomas Schneck; Mark Protsik

[57] ABSTRACT

GaAs/AlGaAs heterostructure lasers containing indium in at least one layer other than or in addition to the active region. Embodiments are described in which indium added in low concentration to the cladding functions to match the lattice constants between the cladding and active layers, in which indium is added in high concentration to form strain layers that prevent defect migration therethrough and if proximate to the active region decrease transparency current and increase differential gain, in which indium is added uniformly to all layers to suppress defect formation, and in which indium is added to a cap layer to reduce metallization contact resistance.

26 Claims, 2 Drawing Sheets

GAAS/ALGAAS HETEROSTRUCTURE LASER CONTAINING INDIUM

Description

1. Technical Field

The present invention relates to semiconductor diode lasers, especially GaAs/GaAlAs heterostructure lasers, and in particular relates to lasers in which lattice strain has been adjusted to bring about improved performance or improved reliability.

2. Background Art

Strained quantum well active regions are currently of interest for extending the laser emission wavelengths of various material systems W. T. Tsang, in *Applied Physics Letters* 38(9), 1 May 1981, pp. 661-663, describes a GaAs/AlGaAs heterostructure laser having an InGaAs active layer. The indium was incorporated into the active layer in order to increase the wavelength of the laser output up to 0.94 $\mu$m. The article also notes that a wavelength extension to 0.88 $\mu$m can be accomplished without significant increase in the threshold current of the laser if the aluminum content of the cladding layers is such that cladding and active layers are exactly lattice matched. Other embodiments described have built-in layer strain due to lattice mismatch, because InGaAs has a larger lattice constant, when the indium content is greater than 2%, than either GaAs or AlGaAs.

One would expect the strain to cause degradation of a laser, with a resulting short lifetime and a significant probability of sudden failure. And, in fact, if a mismatched layer is grown too thick, cracking and other permanent dislocations can result. G. C. Osbourn, in *IEEE Journal of Quantum Electronics*, vol. QE-22, no. 9, Sept., 1986, pp. 1677-1681, describes properties of semiconductor superlattices and quantum-well structures that have mismatched lattices. All the lattice mismatch is accommodated by layer strain without the generation of dislocations if the individual layers are below certain critical thicknesses. The critical thicknesses depend on the amount of lattice mismatch between layers and on the elastic properties of the layer materials. Further, the article notes that it has been observed that strained-layer superstructures tend to act as barriers against dislocation propagation.

Recently, strained layer lasers with InGaAs active layers have been demonstrated to have long life and relatively good reliability despite the built-in strain. S. E. Fischer, et al., in *Applied Physics Letters*, 54(19), 8 May 1989, pp. 1861-1862, report the 5000 hour CW operation of lasers with a single $In_{0.37}Ga_{0.63}As$ quantum well in a GaAs/AlGaAs heterostructure. No sudden failures were observed.

Osbourn, in the above-cited article, also discusses some electronic properties of semiconductor materials caused by layer strain. In particular, strain changes the band structure of the material Bulk energy levels are shifted causing an increase or decrease in the band gap. Certain band degeneracies are split as the bands are distorted by the strain, causing changes in effective hole masses and shifting energy levels. As a result of this, an increase in the gain coefficient and a decrease in the transparency current have been observed in lasers with strained quantum well active regions.

In U.S. Pat. No. 4,712,219, Yano et al. describe a heterostructure laser having an active layer composed of InGaP formed between cladding layers of InAlP. The heterostructure is formed on a GaAs substrate with a graded layer between the substrate and lower cladding layer. The graded layer, which may be composed of InGaAs, InAlP, InAlAs, InAlSb or InGaSb, has a composition that varies from the substrate to the cladding layer so as to result in an approximate coincidence of lattice constants between the graded layer and the cladding layer. The cladding and active layers are lattice matched.

In U.S. Pat. No. 4,769,821, Gotoh describes a GaAs/AlGaAs heterostructure laser having window regions adjacent to the mirror surfaces for higher output power. The window regions are formed by surrounding the heterostructure cladding and active layers with InGaP layers at the laser ends. Because of InGaP's smaller lattice constant, these additional layers apply stress to the active layer, thereby increasing the band gap and reducing absorbance in the end regions.

W. Walukiewicz, in *Applied Physics Letters* 54(20), 15 May 1989, pp. 2009-2011, describes the reduction of dislocation density in a compound semiconductor lattice by isoelectronic doping. Strain introduced locally by randomly distributed dopants lowers the vacancy supersaturation, thereby impeding dislocation formation via vacancy condensation. For GaA, doping with indium to a concentration of $5 \times 10^{19}$ cm$^{-3}$ reduces supersaturation below the critical value for dislocation formation.

In U.S. Pat. No. 4,661,961, Nelson et al. describe an InP laser having an InGaAsP or InGaAs cap layer. These cap layers are described as having low contact resistance for facilitating contact with an electrode. Also, in *Applied Physics Letters* 53, p. 900 (1988) an $In_{0.53}Ga_{0.47}As$ ohmic contact to Pt/Ti was shown to have low resistance.

An object of the invention was to provide improved GaAs/AlGaAs heterostructure lasers with increased differential gain and with reduced degradation rate.

DISCLOSURE OF THE INVENTION

The above object has been met with a semiconductor laser having a multilayer GaAs/AlGaAs heterostructure disposed on a GaAs substrate, wherein at least one cladding layer of the heterostructure other than or in addition to an active region, contains indium. While the prior art incorporates indium into the active region to produce strain, Applicant has recognized that strain can also be introduced into the active region by changing the stoichiometry of the cladding layers adjacent to the quantum well. Accordingly, one embodiment of the invention has a quantum well active region bounded by $In_xAl_yGa_{1-x-y}As$ strain layers, where $0.02 < \times x < 0.5$. The strain layers increase laser gain, thereby improving performance. The strain layers can also be patterned to produce a plurality of spaced apart laser emitters.

Another embodiment in accord with the present invention includes a thin strain layer in the cladding with a concentration of indium greater than 2%. Defect migration through the strain layer is substantially reduced. Either or both cladding layers may have added strain layers. An alternative embodiment incorporates a uniform doping of indium throughout the heterostructure to suppress defect formation.

Another embodiment has a lower indium concentration in the AlGaAs cladding layers above and below the active region than the active region itself. Its indium content is selected such that the lattice constant of each layer of the heterostructure substantially matches that of the other layers. This lattice matching by incorporating indium into the cladding material improves performances by reducing the threshold current while simultaneously improving reliability by suppressing defect formation.

BEST MODE FOR CARRYING OUT THE INVENTION

Figure 1:
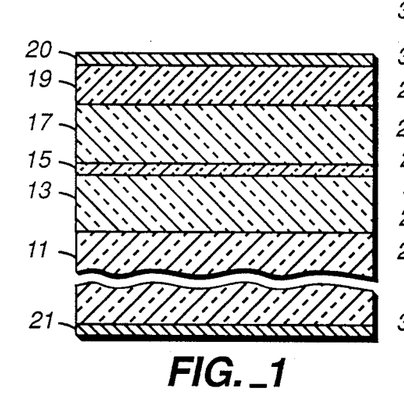
FIG. 1 is a side section of a first semiconductor laser embodiment of the present invention having lattice matching.

With reference to FIG. 1, a first semiconductor laser of the present invention comprises a substrate 11, a first cladding layer 13 disposed above substrate 11, an active region 15 disposed on first cladding layer 13, a second cladding layer 17 disposed on active region 15, a cap layer 19 disposed above second cladding layer 17, and metallization layers 20 and 21 disposed on cap layer 19 and the bottom surface of substrate 11, respectively. A graded buffer layer, not shown, could also be added between substrate 11 and first cladding layer 13.

A typical laser in accord with FIG. 1 has an nGaAs substrate, an n-AlGaAs first cladding layer with approximately 0.002 indium added, a single quantum well active layer of $In_{0.009}Ga_{0.991}As$, a p-AlGaAs second cladding layer, again with approximately 0.002 indium added, and a p-GaAs cap layer, with or without added indium. Other compositions can also be used, provided the lattice constants of the layers, at least cladding and active layers 13, 15 and 17, are substantially matched. In general, because InAs has a larger lattice constant than either GaAs or AlAs, slightly less indium is added to the cladding layers 13 and 17 than to the active layer for a lattice match. InAs should be added in only small amounts to cladding layers 13 and 17, for a concentration of not more than 2% indium, to prevent formation of permanent dislocation defects at the substrate and cap layer boundaries. Cladding layers 13 and 17 are typically about 1 μm thick.

Lattice constants are substantially matched by assuming that the lattice constants of mixed crystals, such as InGaAs, AlGaAs and InAlGaAs, are composites with a linear variation between the lattice constants of their pure crystal constituents, GaAs, AlAs and InAs. For example, GaAs has a lattice constant of 5.65315 Å, AlAs of 5.6622 Å and InAs of 6.05838 Å. Thus, the $In_{0.009}Ga_{0.991}As$ active layer, given above, has a lattice constant of $(0.009)(6.05838 Å)+(0.991)(5.65315 Å)=5.65680 Å$. More generally, each of the cladding layers 13 and 17 and active region layers 15 is composed of $In_{V-\epsilon}Al_{W+\Delta}Ga_{1-(V-\Delta)-(W+\Delta)}As$. "W" and "V"

are constant over all of the layers 13, 15 and 17. The aluminum content $W+\Delta$ of the cladding layers 13 and 17 is greater than an aluminum content $(W+\Delta)'$ of at least one active region quantum well layer. Active region 15 may consist of multiple quantum wells separated by thin barrier layers. Assuming a linear variation of lattice constants, as before, the requirement for lattice matching means that the indium content $V-\epsilon$ in the layers 13, 15 and 17 must vary such that, for any given layer, e is approximately $0.02\Delta$. To achieve any matching at all, the maximum allowable indium content V is 0.02.

Figure 2:
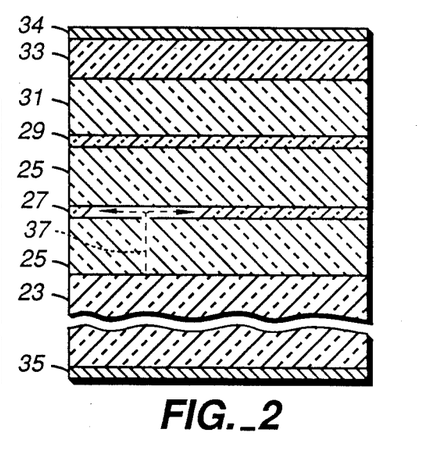
FIG. 2 is a side section of a second semiconductor laser embodiment of the present invention having strain layers in the cladding.

With reference to FIG. 2, a second semiconductor laser comprises a substrate 23, a cladding layer 25 disposed above the substrate 23, a strain layer 27 formed in cladding layer 25, an active region 29 disposed on cladding layer 25, a second cladding layer 31 disposed on active region 29, a cap layer 33 disposed above second cladding layer 31, and metallization layers 34 and 35 disposed on cap layer 33 and a bottom surface of substrate 23 respectively. As in the laser in FIG. 1, active region 29 may consist of a single quantum well layer or, alternatively, of multiple quantum wells separated by thin barrier layers. Again, as in the embodiment in FIG. 1, the substrate 23 may be n-GaAs, the cladding layers 25 and 31 may be n-AlGaAs and p-AlGaAs, respectively, active region quantum wells may be GaAs or InGaAs, and cap layer 33 may be p-GaAs. Other GaAs/AlGaAs heterostructure compositions may also be used, with or without added indium.

A principle aspect of this second laser embodiment is the presence of a strain layer 27 in cladding layer 25. The strain layer 27 is characterized by a lattice constant that differs from the lattice constant of the cladding layer 25 in which it is situated by at least 0.2%. The lattice constant difference is provided by adding a selected high concentration of indium to the cladding material to produce the strain layer 27. By a high concentration we mean more than 2%. For example, strain layer 27 could be composed of $In_{0.1}Al_{0.5}Ga_{0.4}As$ in a cladding layer 25 of $Al_{0.55}Ga_{0.45}As$. The strain layer 27 must be thin, since the mismatched lattice tends to crack if the strain layer is too thick. Accordingly, the strain layer 27 has a thickness which is less than a critical thickness for dislocation generation. Generally, the critical thickness for InAlGaAs strain layers is on the order of 100 nm. Strain layer thicknesses on the order of 10 nm are typical. Strain layer 27 is also limited to a lattice mismatch of not more than about 4% if cracking is to be prevented.

In operation, defects in a laser superstructure tend to migrate toward and, over time, into the active region, causing degradation of laser performance. Because strain layer 27 is not lattice matched to cladding layer 25, the lattice distorts and produces a localized strain field. The local strain field is sufficient to reduce and effectively stop defect migration through the strain layer 27. As seen in FIG. 2, defects 37 reaching the strain layer 27 are pinned there and thus prevented from reaching and degrading the active region 29. While the present embodiment shows only a single strain layer 27 in the cladding layer 25 below the active region 29, other strain layers can also be added, especially in the cladding layer 31 above the active region 29.

Figure 3:
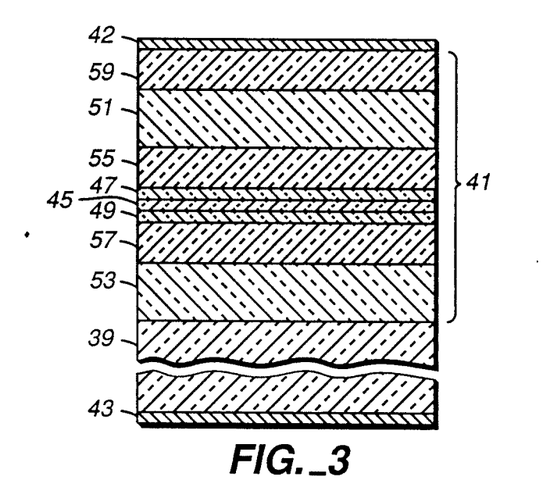
FIG. 3 is a side section of a third semiconductor laser embodiment of the present invention having strain layers bounding the active region.

With reference to FIG. 3, a third semiconductor laser comprises a substrate 39, a multilayer heterostructure 41 disposed on substrate 39, and metallization layers 42 and 43 disposed on top of heterostructure 41 and on a bottom surface of substrate 39, respectively. The multilayer heterostructure 41 includes an active region 45, upper and lower strain layers 47 and 49 bounding active region 45, and cladding layers 51 and 53 above and below strain layers 47 and 49. High band gap, low refractive index confinement layers 55 and 57 may be disposed between strain layer 47 and cladding 51 and between strain layer 49 and cladding 53 for improved carrier confinement and reduced optical losses. A cap layer 59 may be disposed on upper cladding layer 51 for improved metallization contact. Active region 45 may be a single quantum well layer or may consist of multiple quantum wells separated by thin barrier layers. Preferably, the substrate 39 is n-GaAs and heterostructure 41 is a GaAs/GaAlAs heterostructure.

The laser embodiments in FIGS. 2 and 3 are similar in that both include the presence of one or more strain layers 27, 47 and 49. However, whereas the strain layer 27 in FIG. 2 is spaced substantially away from the active region 29 (typically at least 0.5 μm away) so as to avoid having the strain layer 27 affect the band structure in the active region 29, the strain layers 47 and 49 in FIG. 3 are deliberately disposed proximate to the active region 45. The strain layers 47 and 49 are composed of $In_xAl_yGa_{1-x-y}As$, where $0.02 \leq X \leq 0.5$ and y is approximately the same as that in the neighboring confinement layers 57 and 55. The introduction of indium causes the strain layers 47 and 49 to have a lattice constant that is greater than the layer or layers of the active region 45 by at least 0.2%. Each of the strain layers 47 and 49 and the active region 45 has a thickness which is less than the critical thickness for dislocation generation, i.e. less than 100 nm thick.

Figure 4A:
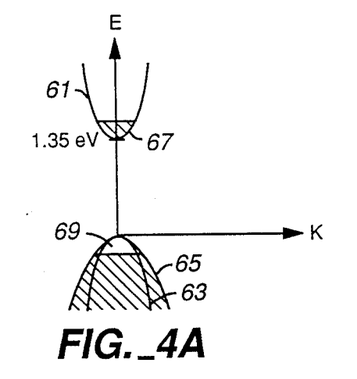
FIGS. 4A and 4B are graphs of band energy E versus wave number k illustrating the effect of the strain layers in the embodiment of FIG. 3.
Figure 4B:
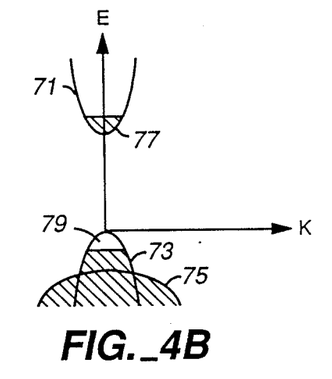

With reference to FIGS. 4A and 4B, adding strain to the active region by means of adjacent strain layers changes the band structure from that of an unstrained laser, and improves laser performance. The band structure of an unstrained laser, like that shown in FIG. 1, is graphically depicted in FIG. 4A. The band structure includes a conduction band 61 with a minimum energy level of about 1.35 eV for GaAs. The electron effective mass for the conduction band is about 0.067 $M_o$, where $M_o$ is the free electron mass. The band structure also includes valence bands 63 and 65. Valence band 63 represents the band for light holes having an effective mass of about 0.12 $M_o$, while valence band 65 represents the band for heavy holes having an effective mass of about 0.8 $M_o$. The valence bands 63 and 65 are degenerate at the center of the Brillouin zona F, i.e. at K=0. Electrically pumping the laser populates the conduction band 61 with electrons 67, leaving holes 69 in both of the valence bands 63 and 65.

By contrast, the band structure of a strained laser, like that shown in FIG. 3, is depicted in FIG. 4. The stress produced by strain layers 47 and 49 on active region 45 alters the light and heavy hole valence bands 73 and 75, breaking the degeneracy at the Γ point (K=0). The energy level of the heavy hole valence band 75 is reduced relative to the light hole valence band 73. Again, electrically pumping the laser populates the conduction band 71 with electrons 77, leaving holes in valence band 73. However, because of the reduced energy level of heavy hole valence band 75, the holes are predominantly light holes. The overall effect is one of decreased effective mass of the valence bands. This decreases the charges required to create a population inversion, and thus a reduction in the transparency current.

Strained quantum well devices of this type also have an increase in the differential gain, or, in the linear approximation, the gain coefficient. This effect decreases the spectral linewidth and increases the modulation bandwidth of the laser.

Returning to FIG. 3, strain can also be introduced into the active region quantum wells by introducing indium into the composition of the active region barrier layers. For example, an active region could be made up of four 12 nm thick quantum wells of $Al_{0.05}Ga_{0.95}As$ separated by three 6 nm thick barrier layers of $In_{0.10}Al_{0.20}Ga_{0.70}As$. Strain layers 47 and 49 might also be composed of $In_{0.10}Al_{0.20}Ga_{0.70}As$ up to 100 nm thick. In the single quantum well case, the active layer might be composed of GaAs bounded by strain layers of $In_{0.10}Al_{0.30}Ga_{0.60}As$. Confinement layers 55 and 57 are typically composed of $Al_{0.40}Ga_{0.60}As$. The composition can vary from that given in the above examples.

The strain in the active region 45 can also be varied laterally across the laser, by laterally altering the concentration of indium x in the $In_xAl_yGa_{1-x}As$ strain layers 47 and 49 in a periodic manner. This patterning would create regions that have higher differential gain than other regions, such that the active region has multiple laser emitters spaced apart in a monolithic linear array. Strain can also be varied laterally by etching away portions of the strain layers 47 and 49. Thus, instead of having strain layers that extend the width of the heterostructure 41, there would be multiple laterally spaced apart strain layers bounding each side of the active region. This is, of course, equivalent to periodically varying the indium content: x between a maximum $0.02 \leq x \leq 0.5$ and zero.

Figure 5:
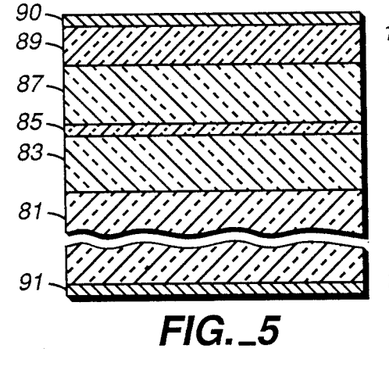
FIG. 5 is a side section of a fourth semiconductor laser embodiment of the present invention having uniform indium doping.

With reference to FIG. 5, a fourth semiconductor laser comprises a substrate 81, a first cladding layer 83 disposed on substrate 81, an active region 85 disposed on first cladding layer 83, a second cladding layer 87 disposed on active region 85, a cap layer 89 disposed on second cladding layer 87, and metallization layers 90 and 91 disposed on cap layer 89 and on a bottom surface of substrate 81, respectively. As with the other laser embodiments, this laser is constructed as a GaAs/AlGaAs heterostructure on a GaAs substrate. In this embodiment, a uniform doping of indium is present throughout the heterostructure. Generally, indium is added to all of the layers at a very low level. The indium content should be less than 2% and is typically on the order of 0.0001%. The addition of a uniform low concentration of indium throughout the heterostructure impedes the growth and migration of defects in the crystal lattice, resulting in a longer lived device.

Figure 6:
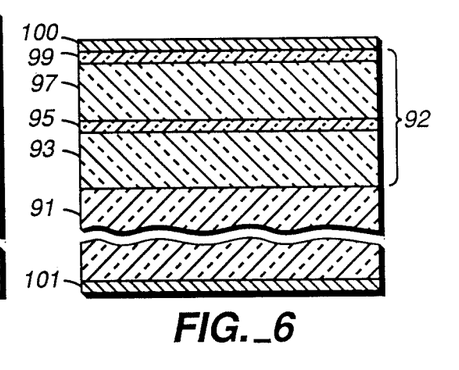
FIG. 6 is a side section of a fifth semiconductor laser embodiment in accord with the present invention having a InGaAs cap.

With reference to FIG. 6, a fifth semiconductor laser comprises a substrate 91, a multilayer GaAs/AlGaAs heterostructure 92 disposed on the substrate, and metallization layers 100 and 101 disposed on top of heterostructure 92 and on the bottom surface of substrate 91. Heterostructure 92 is made up of an active region 95, cladding layers 97 and 93 above and below the active region 95, and a cap layer 99 above the upper cladding layer 97. In this embodiment, at least the cap layer 99 contains indium; although the other layers, particularly cladding layers 93 and 97, may also contain indium. The metallization layers in all of the laser embodiments is typically a sandwich of titanium, platinum and gold material layers.

The cap layer 99 is an ohmic contact layer for a low resistance contact of metallization 100 to the heterostructure 92. Cap layer 99 is composed of $In_xGaAs$, where x ranges from 2 to 30%. Cap layer 99 may also be doped with zinc to a concentration of $2\times10^{19}/cm^3$. Following growth of cap layer 99, an optional rapid thermal anneal to about 450° C. can be used to cause a thin InAs/Ti alloy film to form. Cap layer 99 is not more than 100 nm thick, and is typically only 10 nm thick, so as not to cause strain induced dislocations or other lattice defects.

InGaAs is a lower band gap material than AlGaAs. Accordingly, adding indium to the cap layer reduces the surface work function, and thereby reduces the contact resistance of the metallization layer. A better ohmic contact results. Thermally annealing further improves contact. As with the strain layers in FIG. 2, the indium cap also blocks defect migration, in this case from metal layer 100 and surface oxide residue.

The GaAs lasers with incorporated indium described herein have increased gain and other performance features over previous GaAs lasers. Further, the lasers have a reduced degradation rate, resulting in longer lifetimes.

What is claimed is:

1. In a semiconductor laser, a structure comprising, a GaAs substrate, and a multilayer GaAs/AlGaAs heterostructure disposed on said substrate, said heterostructure including an active region of at least one layer, at least one cladding layer of said heterostructure containing indium.

2. The structure of claim 1 wherein each layer of said heterostructure is characterized by a lattice constant, each layer of said heterostructure having an indium content selected such that its lattice constant substantially matches lattice constants of the other heterostructure layers, whereby strain between heterostructure layers is substantially reduced.

3. The structure of claim 2 wherein AlGaAs cladding layers above and below an active region have a lower indium concentration than said active region.

4. The structure of claim 1 wherein said heterostructure includes a thin strain layer formed in said cladding layer containing a concentration of indium greater than 2%, whereby defect migration through said strain layer is substantially reduced.

5. The structure of claim 1 wherein an active region of said heterostructure includes at least one quantum well layer, said active region being bounded by $In_x Al_y Ga_{1-x-y}As$ strain layers, where $0.02<X<<0.5$, whereby strain is placed on said active region quantum well layers so as to increase gain.

6. The structure of claim 1 wherein a uniform doping of indium is present throughout said heterostructure.

7. The structure of claim 1 wherein said heterostructure further includes a thin $In_xGa_{1-x}As$ cap layer, where x ranges from 2 to 30%, said cap layer being less than 100 μm thick, whereby a metallization layer placed on said cap layer is characterized by reduced contact resistance.

8. The structure of claim 7 wherein a thin InAs/Ti alloy contact layer is present between said cap layer and said metallization layer.

9. In a semiconductor laser, a structure comprising, a substrate, a first cladding layer disposed above said substrate, an active region disposed on said first cladding layer, and a second cladding layer disposed on said active region, wherein each of said first and second cladding layers and said active region is composed of $In_{V-E}Al_{W+\Delta}Ga_{1-(V-E)-(W+\Delta)}As$, the aluminum content $W+\Delta$ of said cladding layers being greater than an aluminum content $(W+\Delta)'$ of at least one layer in said active region, the indium content V-E in said layers varying such that, for any layer, E is approximately $0.02\Delta$, whereby lattice constants of said layers are substantially matched, the quantity v being at most 0.02.

10. In a semiconductor laser, a structure comprising: a substrate, and a multilayer heterostructure disposed on said substrate, said heterostructure including an active region, cladding layers above and below said active region and at least one strain layer in one of said cladding layers, said strain layer having a thickness which is less than a critical thickness for dislocation generation, said strain layer having a lattice constant that differs from a lattice constant of said one of said cladding layers by at least 0.2% but not more than 4%, whereby a localized strain field is produced from lattice distortion at said strain layer sufficient to substantially reduce migration of defects through said strain layer.

11. The structure of claim 10 wherein said strain layer has a thickness on the order of 10 nm.

12. The structure of claim 10 wherein said strain layer is composed of InAlGaAs in an AlGaAs cladding layer, said strain layer having an indium content selected to provide said lattice constant difference.

13. The structure of claim 10 wherein said strain layer is disposed in said cladding layer below said active region.

14. The structure of claim 10 wherein strain layers are disposed in cladding layers both above and below said active region.

15. The structure of claim 10 wherein said strain layer is disposed in said cladding layer spaced away from said active region by a distance selected to avoid having said strain layer affect the band structure in the active region.

16. The structure of claim 10 wherein a pair of strain layers are disposed proximate to said active region, whereby a localized strain field is introduced into said active region.

17. The structure of claim 10 wherein said heterostructure is a GaAs/AlGaAs heterostructure with indium selectively added to produce said strain layer.

18. In a semiconductor laser, a structure comprising, a substrate, and a multilayer heterostructure disposed on said substrate, said heterostructure including an active region with at least one quantum well layer, and strain layers bounding said active region, each of said strain layers having a thickness which is less than a critical thickness for dislocation generation, said strain layers having a lattice constant that differs from said active region layers by at least 0.2%, said strain layers containing indium.

19. The structure of claim 18 wherein said active region has multiple quantum wells.

20. The structure of claim 18 wherein each of said strain layers extend across the width of said heterostructure.

21. The structure of claim 18 wherein there are multiple laterally spaced apart strain layers bounding each side of said active region, whereby said active region has multiple laser emitters.

22. The structure of claim 18 wherein barrier layers of said active region between multiple quantum wells of said active region also contain indium.

23. In a semiconductor laser, a structure comprising,
a substrate,
a multilayer GaAs/GaAlAs heterostructure disposed on said substrate, said heterostructure including an active region, cladding layers above and below said active region and a cap layer above said cladding layer above said active region, at least said cap layer containing indium, said cap layer having a lower band gap than said cladding layer above said active region, and
metallization layers disposed on a bottom surface of said substrate and a top surface of said cap layer.

24. The structure of claim 23 wherein said metallization layer on said cap layer is a sandwich of titanium, platinum and gold material layers.

25. The structure of claim 23 where there is a thin InAs/Ti alloy film disposed between said cap layer and said metallization layer.

26. The structure of claim 23 wherein said cladding layers also contain indium.

* * * * *

UNITED STATES PATENT AND TRADEMARK OFFICE
CERTIFICATE OF CORRECTION

PATENT NO. : 4,984,242

DATED : January 8, 1991

INVENTOR(S) : Donald R. Scifres et al.

It is certified that error appears in the above-identified patent and that said Letters Patent is hereby corrected as shown below:

Title page item [54] title, "GAAS/ALGAAS HETEROSTRUCTURE LASER CONTAINING INDIUM" should read - -GaAs/AlGaAs HETEROSTRUCTURE LASER CONTAINING INDIUM- -.

Column 1, lines 1-2, title "GAAS/ALGAAS HETEROSTRUCTURE LASER CONTAINING INDIUM" should read
- -GaAs/AlGaAs HETEROSTRUCTURE LASER CONTAINING INDIUM- -.

Column 1, line 15, "material systems W. T. Tsang" should read - -material systems. W. T. Tsang- -.

Column 2, line 24, the words "For GaA," should read
- -For GaAs,- -.

Column 2, line 52, "$In_xAL_yGA_{1-x-y}As$" should read
- -$In_xAl_yGa_{1-x-y}As$- -.

Column 2, line 52, "$0.02 < X x < 0.5$" should read
- -$0.02 < x < 0.5$- -.

UNITED STATES PATENT AND TRADEMARK OFFICE
CERTIFICATE OF CORRECTION

PATENT NO. : 4,984,242

DATED : January 8, 1991

INVENTOR(S) : Donald R. Scifres et al.

It is certified that error appears in the above-identified patent and that said Letters Patent is hereby corrected as shown below:

Column 3, line 68, "$In_{V-\epsilon}Al_{W+\Delta}Ga_{1-(V-\Delta)-(W+\Delta)}As$" should read
-- $In_{V-\epsilon}Al_{W+\Delta}Ga_{1-(V-\epsilon)-(W+\Delta)}As$ --.

Column 5, line 50, "Brillouin zona F" should read
-- Brillouin zone $\Gamma$ --.

Column 6, lines 11-12, "layers of $In_{0.10}Al_{0.20}Ga_{0.70}As$" should read
-- layers of $In_{0.10}Al_{0.20}Ga_{0.70}As$ --.

Column 6, lines 15-16, "layers of $In_{0.10}Al_{0.30}Ga_{0.60}As$" should read
-- layers of $In_{0.10}Al_{0.30}Ga_{0.60}As$ --.

UNITED STATES PATENT AND TRADEMARK OFFICE
CERTIFICATE OF CORRECTION

PATENT NO. : 4,984,242

DATED : January 8, 1991

INVENTOR(S) : Donald R. Scifres et al

It is certified that error appears in the above-identified patent and that said Letters Patent is hereby corrected as shown below:

Column 6, line 32, "content: x" should read - -content x- -.

Signed and Sealed this

Thirtieth Day of June, 1992

Attest:

DOUGLAS B. COMER

*Attesting Officer*          Acting Commissioner of Patents and Trademarks